(12) United States Patent
Lin

(10) Patent No.: US 6,611,025 B2
(45) Date of Patent: Aug. 26, 2003

(54) APPARATUS AND METHOD FOR IMPROVED POWER BUS ESD PROTECTION

(75) Inventor: Shi-Tron Lin, Taipei (TW)

(73) Assignee: Winbond Electronics Corp. (TW)

( * ) Notice: Subject to any disclaimer, the term of this patent is extended or adjusted under 35 U.S.C. 154(b) by 0 days.

(21) Appl. No.: 09/946,247

(22) Filed: Sep. 5, 2001

(65) Prior Publication Data

US 2003/0052367 A1 Mar. 20, 2003

(51) Int. Cl.$^7$ ............................................. H01L 23/62
(52) U.S. Cl. ........................................ 257/355; 257/360
(58) Field of Search .................. 257/355, 360, 257/204, 379

(56) References Cited

U.S. PATENT DOCUMENTS

| 5,248,892 | A |   | 9/1993  | Van Roozendaal et al. |
|-----------|---|---|---------|-----------------------|
| 5,283,499 | A |   | 2/1994  | Adam et al.           |
| 5,378,919 | A | * | 1/1995  | Ochiai ........................ 257/204 |
| 5,548,134 | A | * | 8/1996  | Tailliet ........................ 257/173 |
| 5,610,790 | A | * | 3/1997  | Staab et al. .................... 361/56 |
| 5,721,439 | A |   | 2/1998  | Lin                   |
| 5,747,853 | A | * | 5/1998  | So et al. ...................... 257/355 |
| 5,932,918 | A | * | 8/1999  | Krakauer ..................... 257/368 |
| 5,937,298 | A |   | 8/1999  | Hung et al.           |
| 5,940,258 | A | * | 8/1999  | Duvvury ........................ 361/56 |
| 5,973,363 | A |   | 10/1999 | Staab et al.          |
| 5,973,382 | A |   | 10/1999 | Burgener et al.       |
| 6,025,631 | A | * | 2/2000  | Lin ............................. 257/355 |
| 6,046,087 | A |   | 4/2000  | Lin et al.            |
| 6,057,555 | A |   | 5/2000  | Reedy et al.          |
| 6,064,095 | A |   | 5/2000  | Fu                    |
| 6,153,913 | A | * | 11/2000 | Hsu                   |
| 6,157,065 | A |   | 12/2000 | Huang et al.          |
| 6,215,156 | B1|   | 4/2001  | Yang                  |
| 6,225,166 | B1|   | 5/2001  | Hsu et al.            |
| 6,236,073 | B1|   | 5/2001  | Hsu                   |
| 6,274,908 | B1| * | 8/2001  | Yamaguchi et al. ......... 257/355 |
| 6,476,449 | B1| * | 11/2002 | Lin ............................. 257/360 |

* cited by examiner

Primary Examiner—Amir Zarabian
Assistant Examiner—Monica Lewis
(74) Attorney, Agent, or Firm—Raymond Sun

(57) ABSTRACT

A number of different arrangements of island structures are utilized for improved ESD protection. The MOSFET structure provides islands that are selectively positioned among a group of ESD protection devices for protecting the power-bus, input pins, output pins and I/O pins to achieve ESD improvement in a manner which improves overall ESD protection strength while reducing the complexity of IC simulation and modeling.

21 Claims, 13 Drawing Sheets

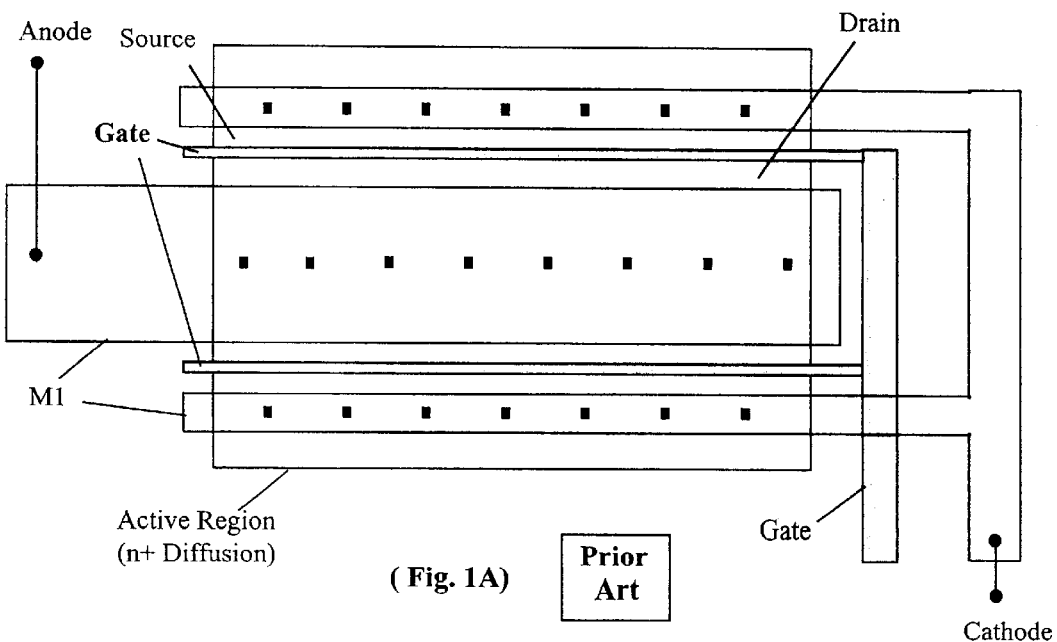
(Fig. 1A) Prior Art
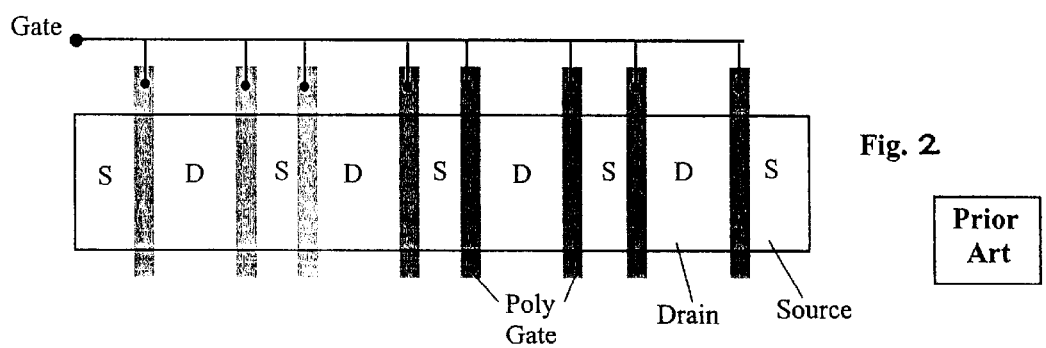
Fig. 2 Prior Art
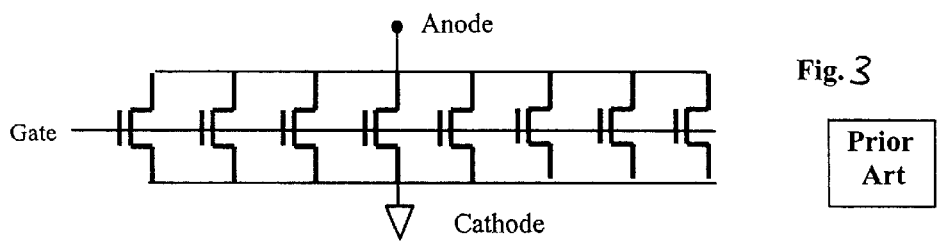
Fig. 3 Prior Art

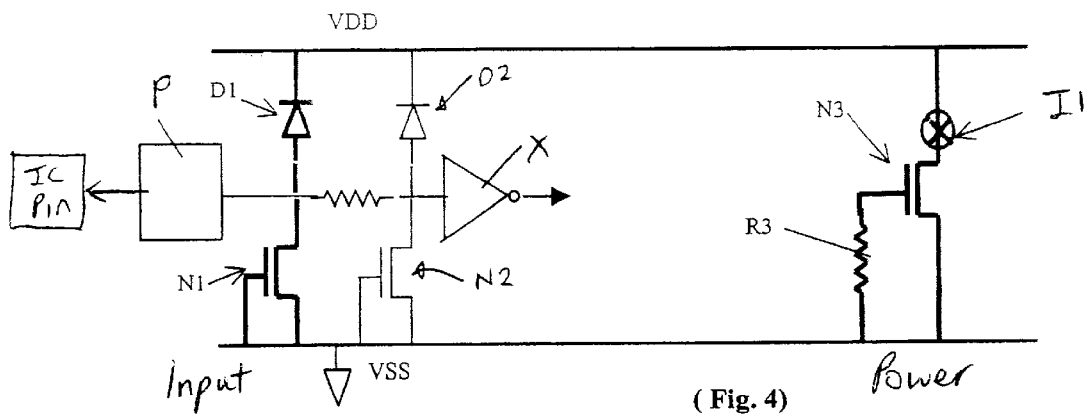
(Fig. 4)
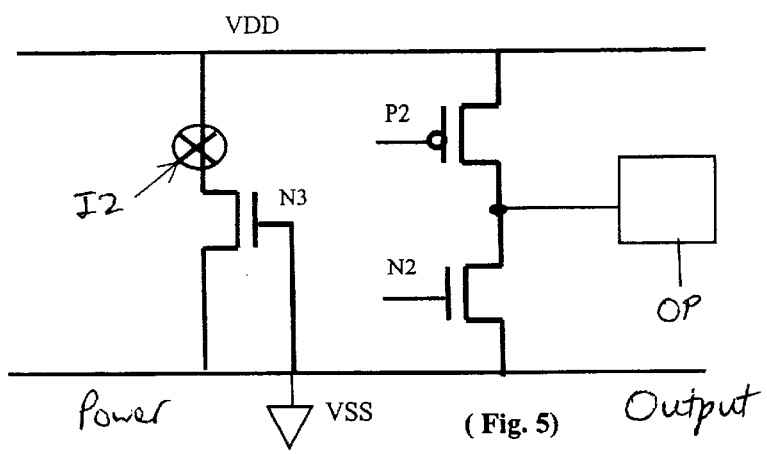
(Fig. 5)
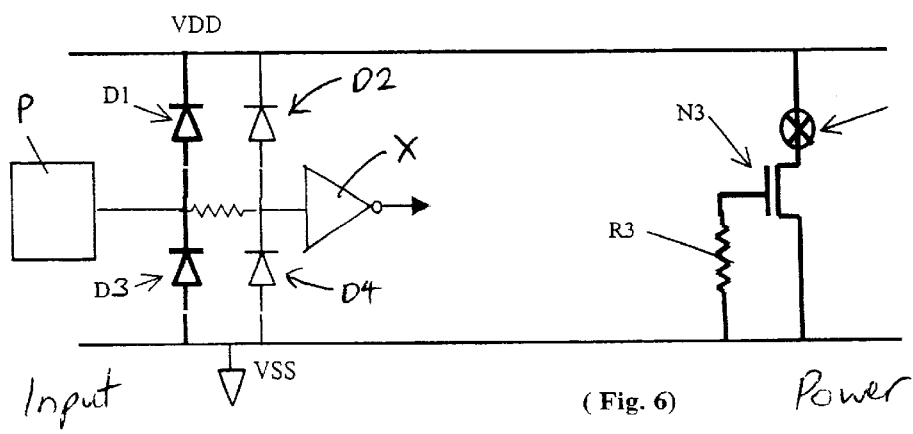
(Fig. 6)

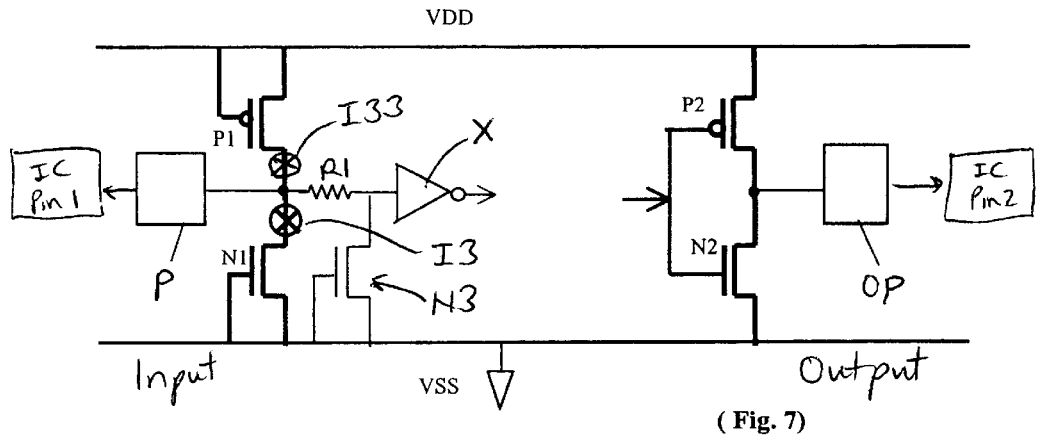
(Fig. 7)
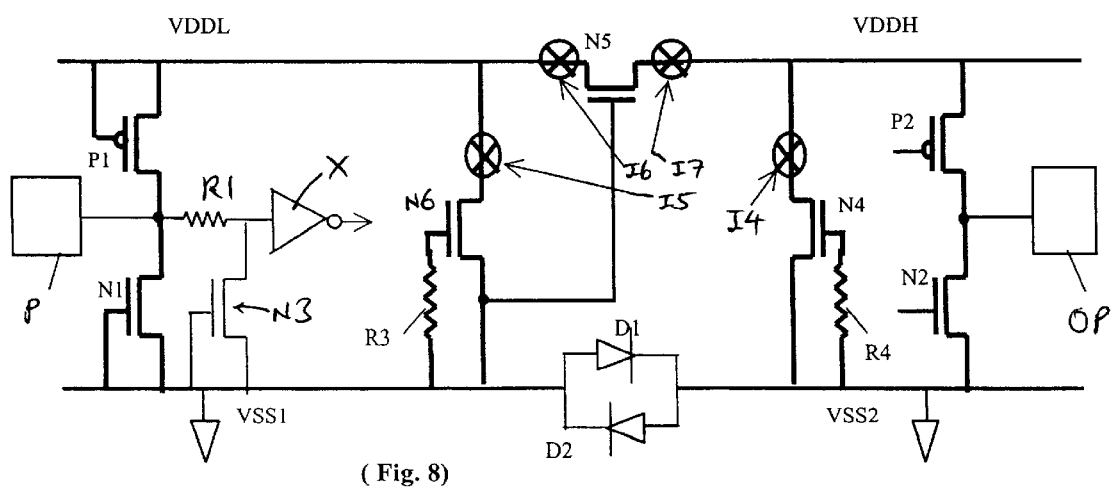
(Fig. 8)

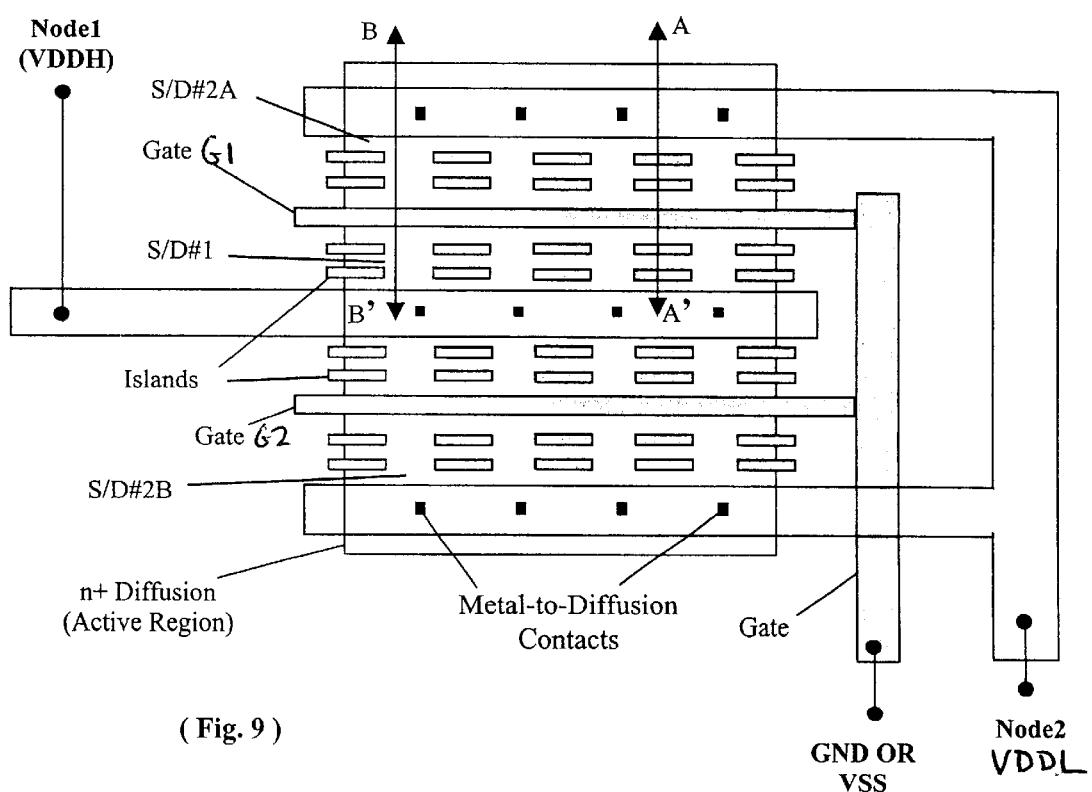
(Fig. 9)

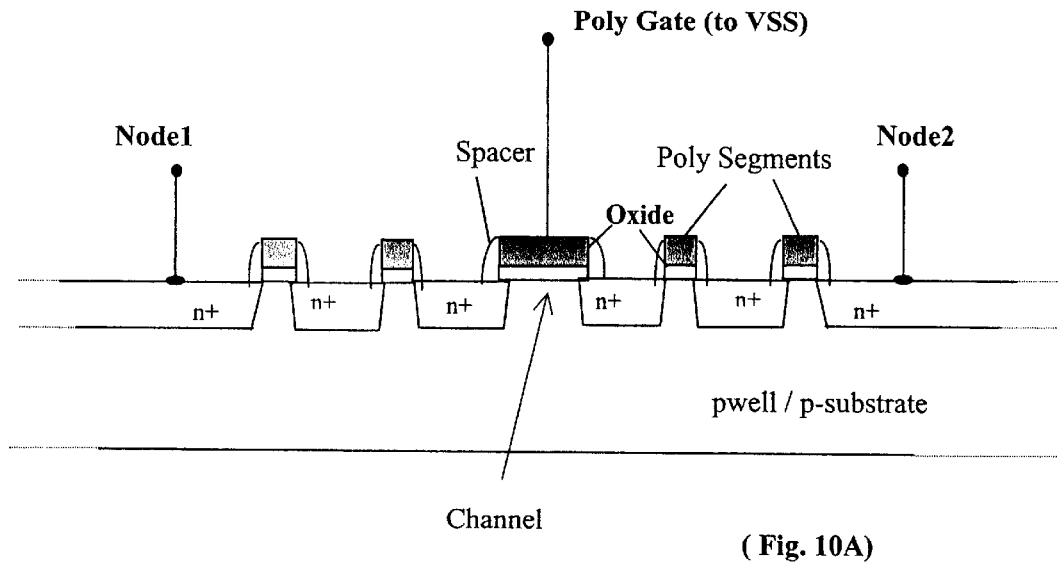
(Fig. 10A)
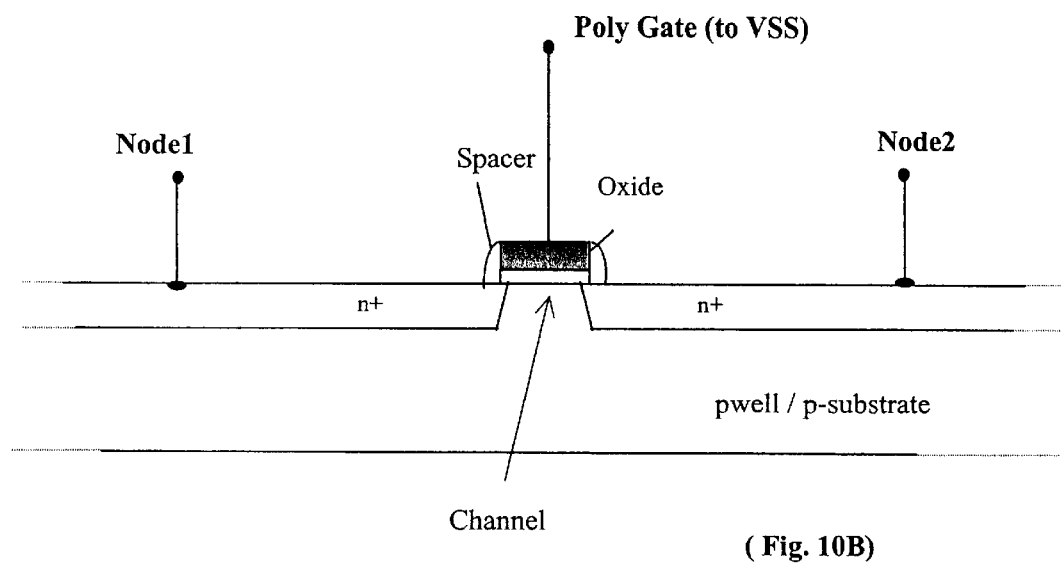
(Fig. 10B)

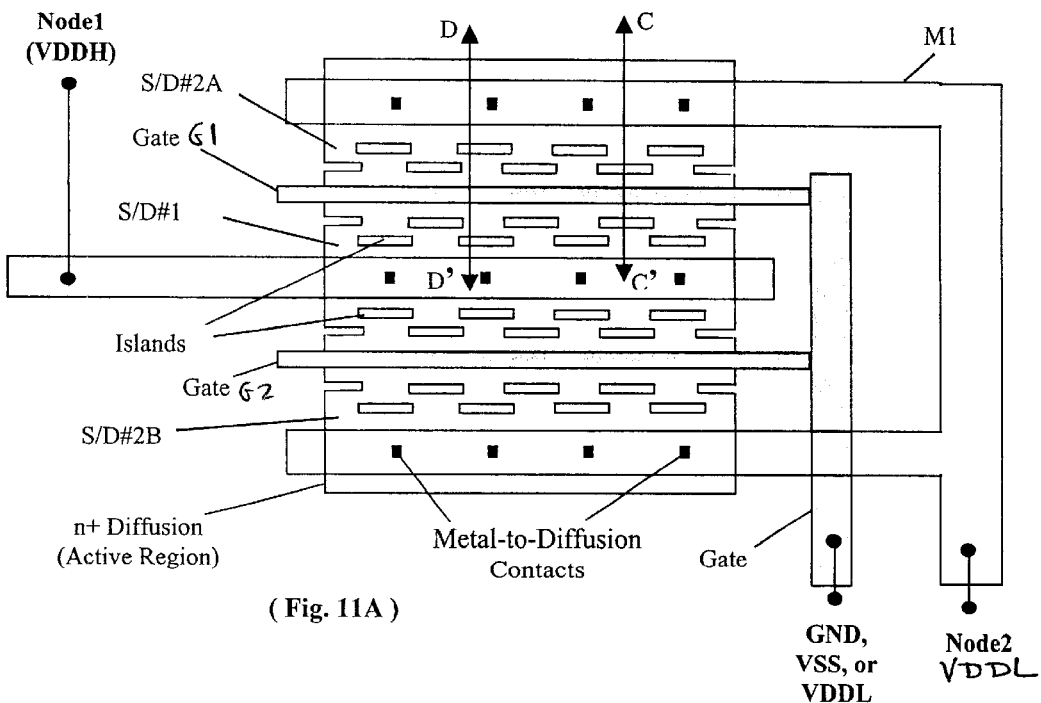
(Fig. 11A)
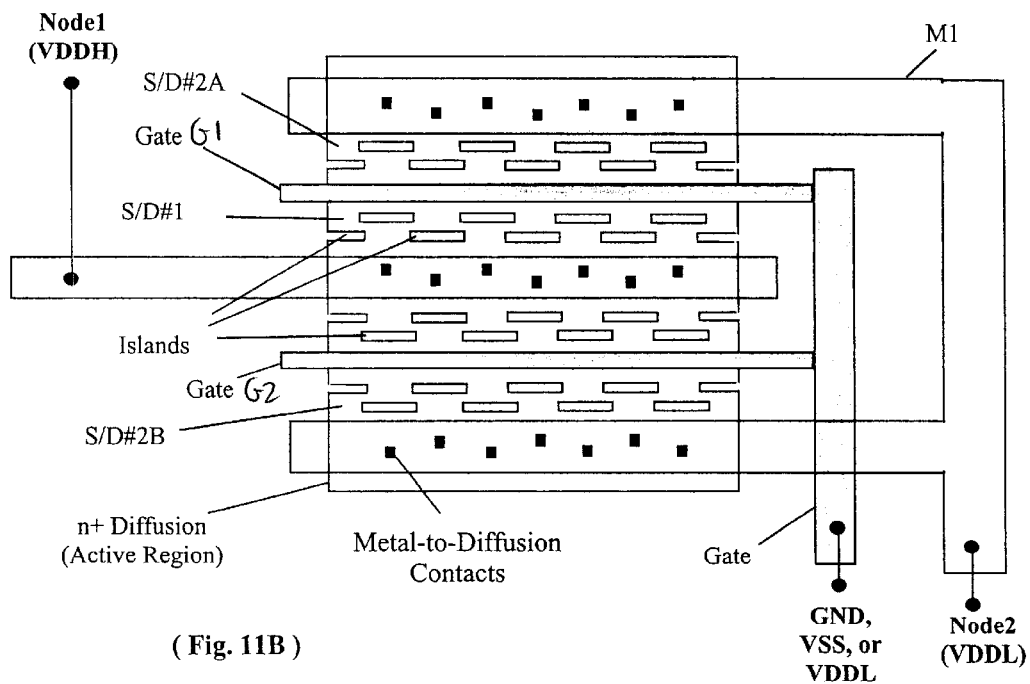
(Fig. 11B)

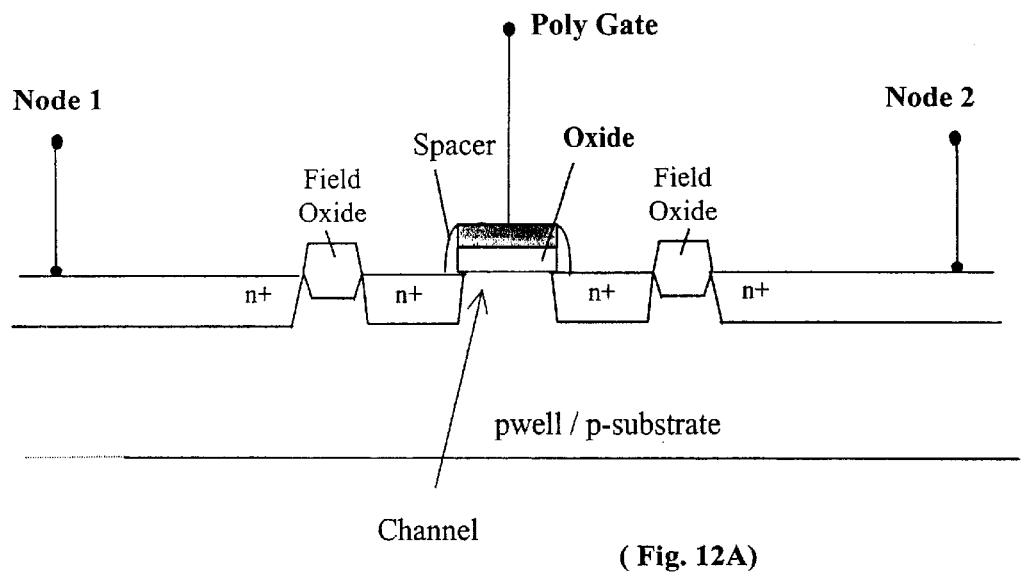
(Fig. 12A)
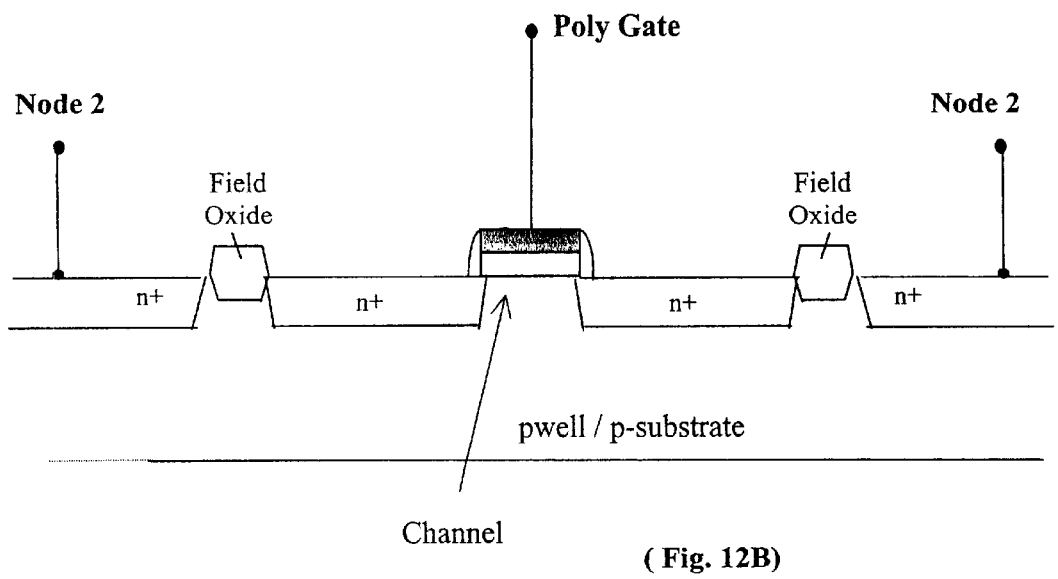
(Fig. 12B)

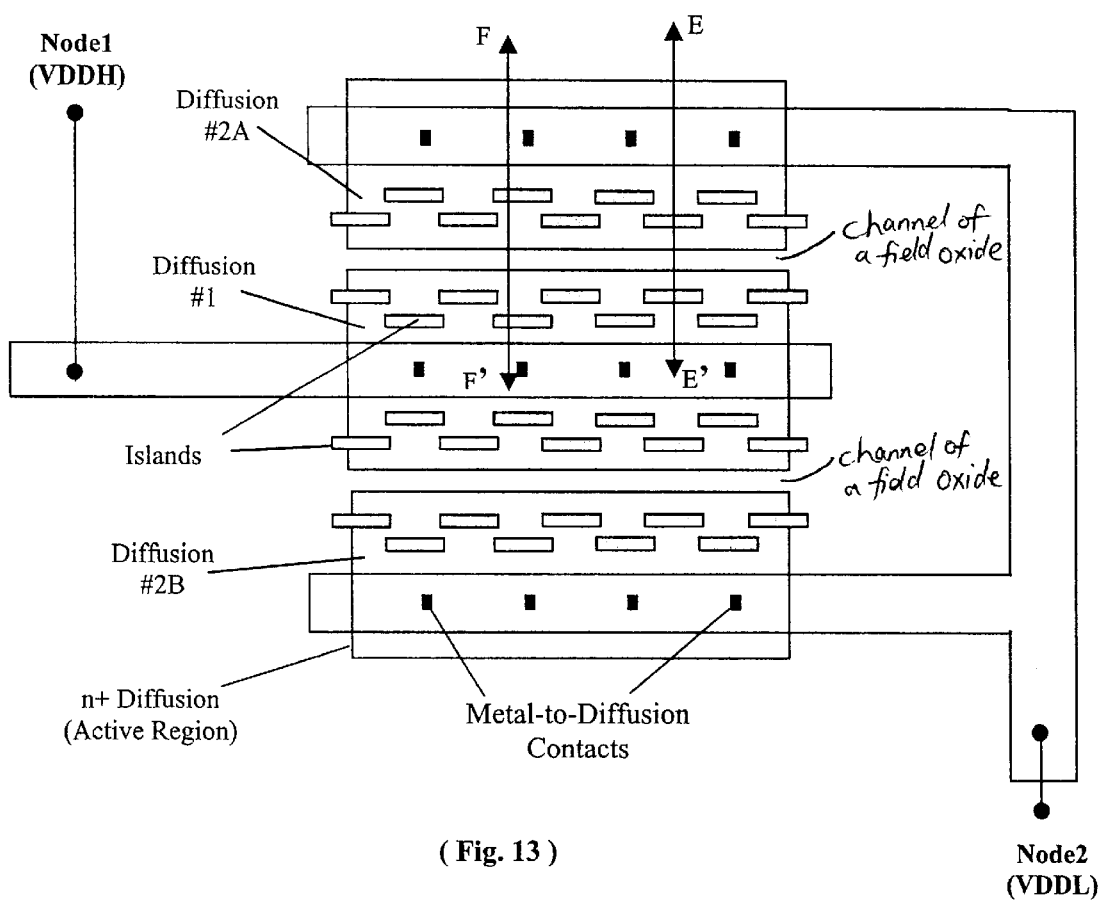
( Fig. 13 )

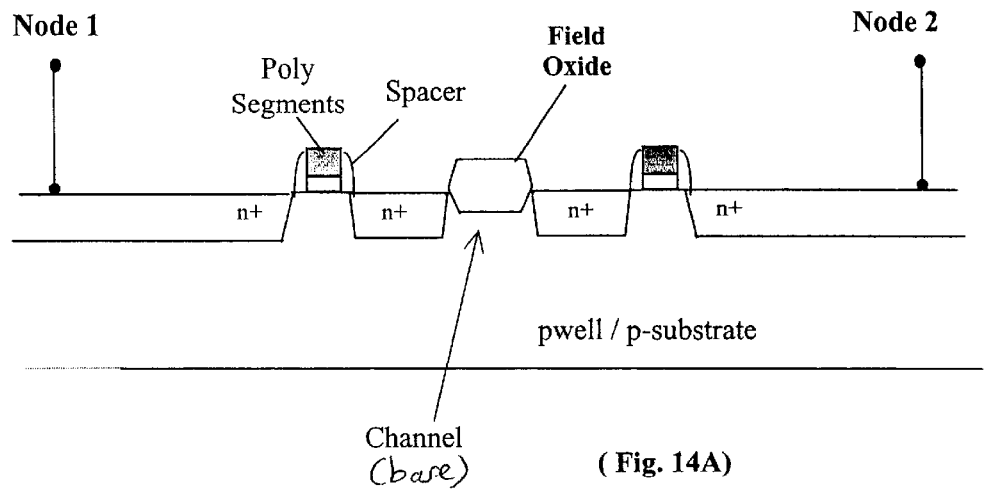
(Fig. 14A)
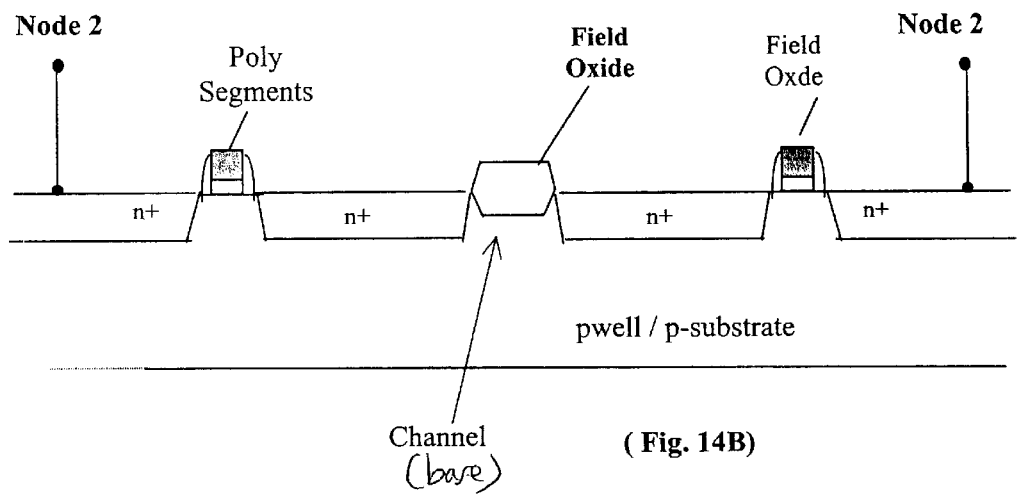
(Fig. 14B)

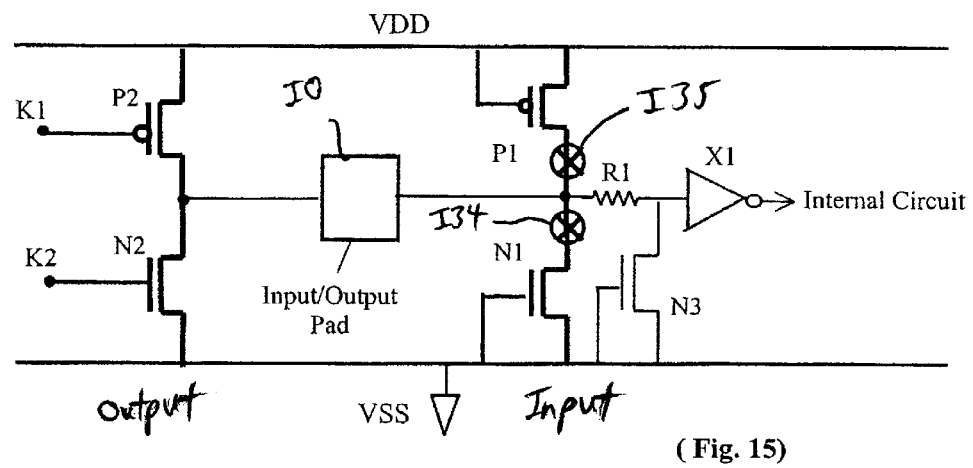
(Fig. 15)
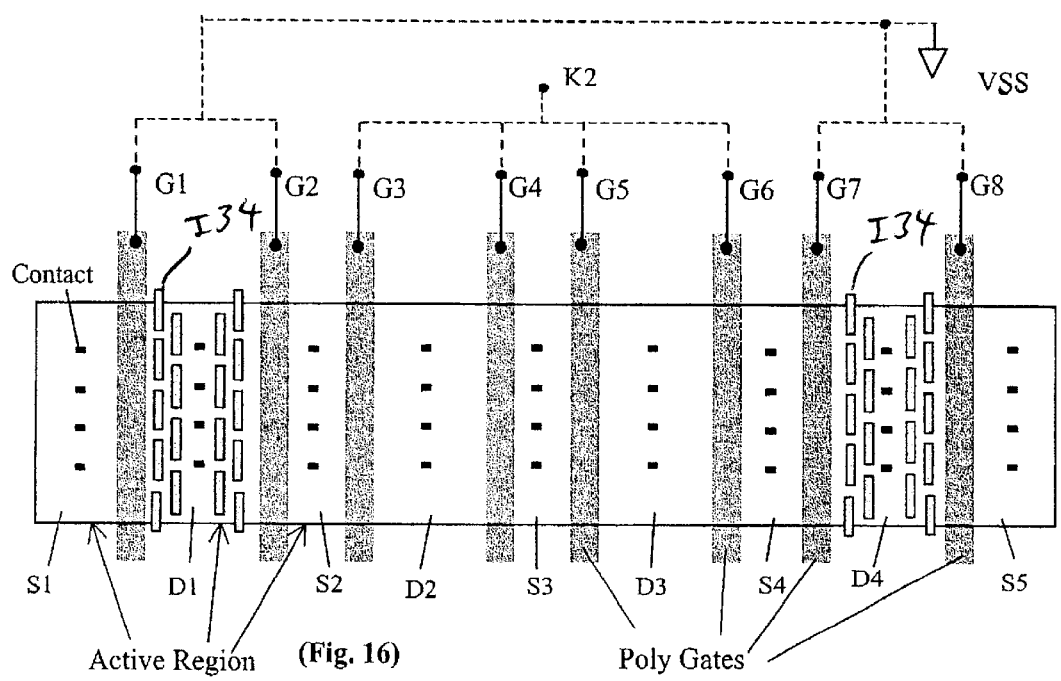
(Fig. 16)

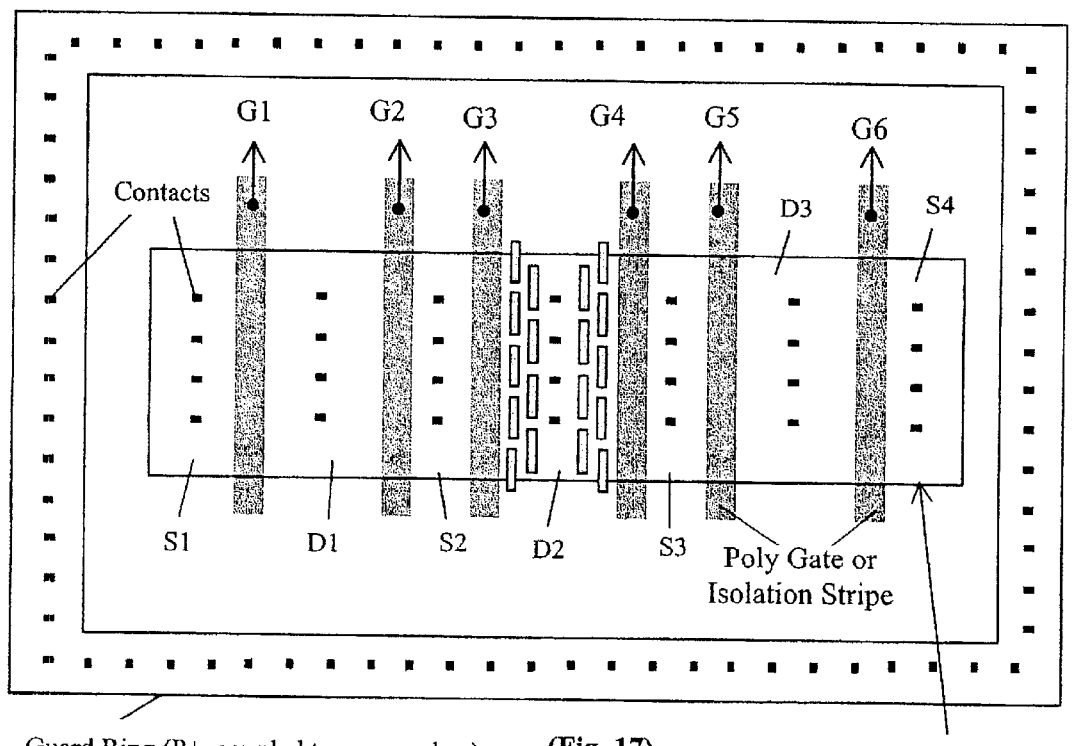
(Fig. 17)

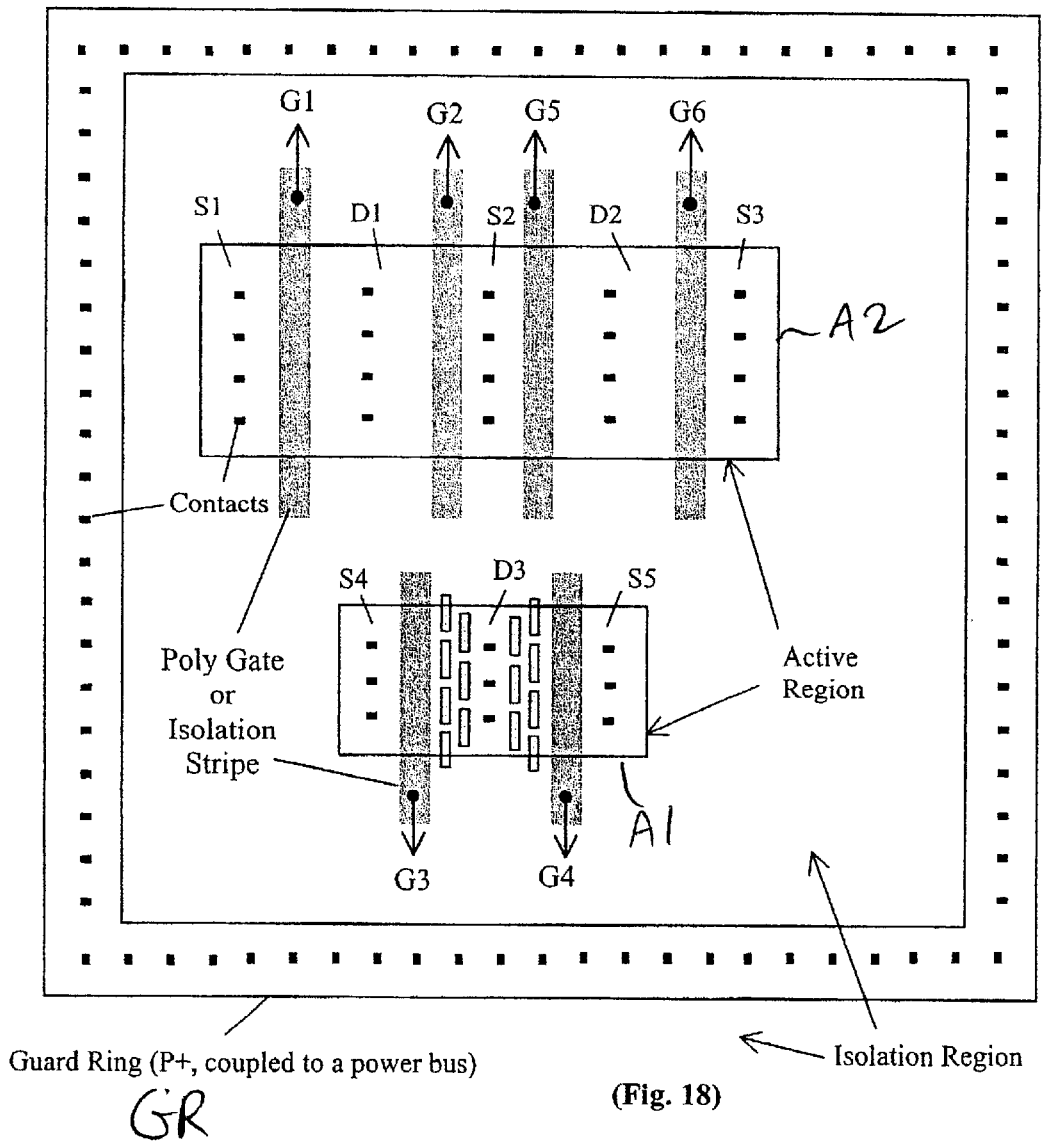
(Fig. 18)

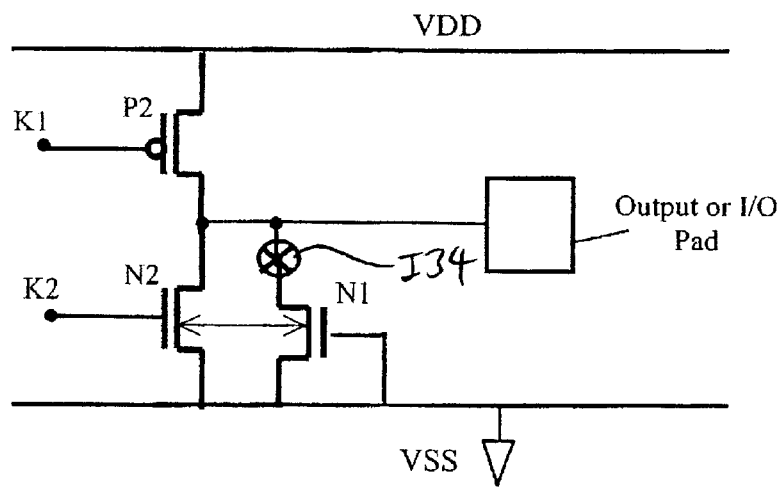
(Fig. 19)
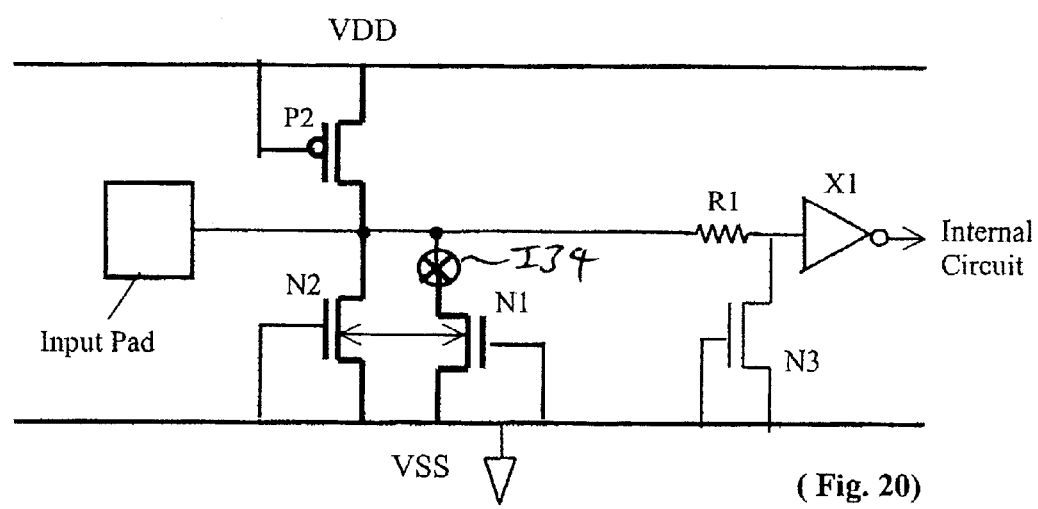
(Fig. 20)

APPARATUS AND METHOD FOR IMPROVED POWER BUS ESD PROTECTION

BACKGROUND OF THE INVENTION

1. Field of the Invention

The present invention relates to electrostatic discharge (ESD) protection in semiconductor integrated circuit (IC) devices, and in particular, to a ESD protection circuit and method that utilizes the selective placement of islands to protect selected pins.

2. Background Art a. NMOS Transistors as ESD Protection Devices

NMOS transistors have been widely used as ESD protection devices. In one application, with the gate connected to the gate-driving signal, the NMOSFET is used as the pull-down device of a CMOS buffer to drive the output voltage. In another application, with the gate electrically coupled to ground, the NMOSFET is used to protect an input pin or power bus during an ESD event.

The ESD protection of an NMOSFET depends heavily on the snap-back phenomenon for conducting large amounts of ESD current between the drain and the source. The snap-back phenomenon can be described as follows. To start, the high electric field at the drain junction causes impact ionization, which generates both minority carriers and majority carriers. The minority carriers flow toward the drain contact and the majority carriers flow toward the substrate/p-well contact causing a local potential build up in the current path in the p-well. When the local substrate potential is 0.7 volts higher than the adjacent n+ source potential, the source junction becomes forward biased. The forward biased source junction injects minority carriers (electrons) into the p-well, and those minority carriers eventually reach the drain junction to further enhance the impact ionization. This creates a continuous loop so that the MOSFET gets into a low impedance (snap back) state to conduct large amounts of ESD current to accomplish the necessary electrostatic discharge protection.

For ESD protection, NMOS drain contacts are typically kept a few microns away from the gate edge. There is a distributed resistance of the n+ drain diffusion that helps the uniformity of the ESD current flow from the NMOS drain contacts to the source. This is because if the ESD transient current starts to localize at a weak spot near a gate edge, the distributed drain resistance helps to raise the potential of adjacent diffusion area. This causes the entire ESD current to swamp in at a localized spot, thereby causing local heating and eventually damages the device. For this reason, the n+ distributed resistance of the drain region helps an entire gate finger to turn on during an ESD event.

b. Silicide-Processed NMOSFETs

In a salicide process, the silicided diffusion causes ESD performance to degrade due to the much-reduced drain sheet resistance (2 to 3 ohms per square). The ESD high voltage travels directly to the gate-diffusion edge and causes localized gate oxide rupture or source-drain shorts before an entire gate finger can be turned on, much less before multiple gate fingers can be turned on. This is important because an entire gate finger being turned on means that ESD current is flowing from the drain to the source through underneath the entire gate finger, which is more effective for ESD protection than if the ESD current only flows through underneath a portion of the gate finger. One known solution is to use a salicide block, but this is inefficient because the process is complex and one extra mask is required.

c. Multi-Gate Fingered NMOSFET

Due to the need to absorb high ESD transient current, an NMOSFET ESD protection device is typically constructed as a multi-gate-finger structure, an example of which is shown in the layout diagrams of FIGS. 1 and 2. FIG. 3 is the equivalent circuit for FIGS. 1 and 2. However, one known problem with the multi-finger structure is that not all the gate fingers might turn on during an ESD event. Specifically, when the first few gate fingers quickly turn on, these turned-on gate fingers may quickly transition into a snap-back low-impedance condition, thereby reducing the drain terminal to source terminal voltage to a transient voltage that is less than the trigger voltage of the NMOS device, which potentially prevents other gate fingers from turning on. Therefore, with only a partial number of gate fingers turned on to absorb the the ESD energy, the size of the NMOSFET is effectively reduced and the ESD performance degrades.

d. Full-Chip ESD Protection Considerations for Single-Supply and Multiple-Supply ICs ESD protection devices are typically needed to protect input pins, output pins, I/O pins, and power-bus pins in ICs from being damaged by ESD events.

For a multiple-supply (or called "multi-supply") IC, there is a further need to place an ESD protection device between different power buses (such as between VDDH=3.3V and VDDL=2.5V buses). In this case, the positive or negative ESD transient pulses can appear at either one of the power-bus pins, so that each of the two diffusion regions of the MOSFET can be either the source side or the drain side. In addition, the transient ESD current can flow in either direction from the first source/drain (S/D) region to the second S/D region, or vice versa.

e. Known Solutions

U.S. Pat. No. 5,721,439 disclosed a MOS transistor structure having a number of isolated islands in the drain diffusion region. The ESD transient current flows around those isolated islands from the drain contacts towards the drain-gate edge, thereby creating a distributed drain resistance effect for improving ESD protection. However, the implementation of these island structures in the diffusion region of a MOS transistor inadvertently adds to the complexity of device modeling. In one aspect, the structure at least partially divides electrical current into diverted paths and the resultant distributed resistance needs to be modeled correctly. In another aspect, there is a change in the associated diffusion-to-substrate capacitance, which affects the device speed performance and needs to be modeled precisely for accurate IC circuit timing/speed simulation. However, the available simulation and modeling tools do not typically address modeling parameters associated with island-like structures such as one with floating poly segments.

Therefore, there is a need to implement the island-like structure in an IC to provide significant improvement in ESD performance while minimizing the complexity of the device modeling.

SUMMARY OF THE INVENTION

It is an object of the present invention to provide an ESD protection circuit that overcomes the problems identified above.

It is another object of the present invention to provide an ESD protection circuit that provides improved ESD protection.

It is yet another object of the present invention to provide an ESD protection circuit that minimizes complexity in device modeling.

It is a further object of the present invention to provide an ESD protection circuit that selectively positions its islands to optimize ESD protection.

To accomplish the objectives of the present invention, there is provided a number of different arrangements of island structures for improved ESD protection.

In one aspect, the MOSFET structure provides islands that are selectively positioned among a group of ESD protection devices for protecting the power-bus, input pins, output pins and I/O pins to achieve ESD improvement in a manner which minimizes the complexity of IC simulation and modeling. In one embodiment, island structures are positioned in the drain diffusion region of selected transistors in an ESD protection device, with the other transistors of the ESD protection device being devoid of island structures. In another embodiment, some of the drain regions in the a given transistor can contain island structures, while the other drain regions of the same transistor can be devoid of island structures.

In another aspect, island structures can be positioned in the drain and source diffusion regions of selected transistors in an ESD protection device. As a non-limiting example, a dual-direction MOSFET structure with islands is placed between different power buses for a multi-supply integrated circuit. In one embodiment, the island structure between different power buses for the multi-supply integrated circuit can have aligned gaps between adjacent islands.

BRIEF DESCRIPTION OF THE DRAWINGS

The invention can be more fully understood by reading the subsequent detailed description of the preferred embodiments, with reference made to the accompanying drawings.

FIG. 1A is a schematic top view of a conventional ESD protection circuit.

FIGS. 2 and 3 show equivalent circuits of the ESD protection circuit of FIG. 1A.

FIG. 4 is a schematic top view of an ESD protection circuit according to one embodiment of the present invention.

FIG. 5 is a schematic top view of an ESD protection circuit according to another embodiment of the present invention.

FIG. 6 is a schematic top view of an ESD protection circuit according to a further embodiment of the present invention.

FIG. 7 is a schematic top view of an ESD protection circuit according to yet another embodiment of the present invention.

FIG. 8 is a schematic top view of an ESD protection circuit according to yet another embodiment of the present invention in a multiple-supply integrated circuit.

FIG. 9 is a schematic top view of one of the ESD protection devices N5 in FIG. 8.

FIG. 10A is a cross-sectional view of the circuit of FIG. 9 taken line A–A' thereof.

FIG. 10B is a cross-sectional view of the circuit of FIG. 9 taken line B–B' thereof.

FIGS. 11A and 11B are schematic top views of ESD protection circuits according to further embodiments of the present invention.

FIG. 12A is a cross-sectional view of the circuit of FIG. 11A taken line C–C' thereof.

FIG. 12B is a cross-sectional view of the circuit of FIG. 11A taken line D–D' thereof.

FIG. 13 is a schematic top view of an ESD protection circuit according to a further embodiment of the present invention.

FIG. 14A is a cross-sectional view of the circuit of FIG. 13 taken line E–E' thereof.

FIG. 14B is a cross-sectional view of the circuit of FIG. 13 taken line F–F' thereof.

FIG. 15 is a schematic top view of an ESD protection circuit according to yet another embodiment of the present invention.

FIGS. 16–18 are layout views of different non-limiting embodiments for configuring certain elements of the ESD protection circuit of FIG. 15.

FIG. 19 illustrates a modification to the circuit of FIG. 15.

FIG. 20 illustrates a modification to the circuits of FIGS. 15 and 19.

DETAILED DESCRIPTION OF THE INVENTION

In the following description, for purposes of explanation and not limitation, specific details are set forth in order to provide a thorough understanding of the present invention. However, it will be apparent to one skilled in the art that the present invention may be practiced in other embodiments that depart from these specific details. In certain instances, detailed descriptions of well-known or conventional data processing techniques, hardware devices and circuits are omitted so as to not obscure the description of the present invention with unnecessary detail.

The present invention provides important applications associated with island structures for ESD protection. In one aspect, the MOSFET structure provides islands that are selectively positioned among a group of ESD protection devices for protecting the power-bus, input pins, output pins and I/O pins to achieve ESD improvement in a manner which minimizes the complexity of IC simulation and modeling. In another aspect, a dual-direction MOSFET structure with islands is placed between different power buses for a multi-supply integrated circuit.

For an input circuit, the drain of an NMOS ESD protection device is coupled to an input pad and internal circuit. Since the gate is grounded for the NMOS ESD protection transistor, it is not turned on during circuit operation. Therefore, the drain-to-the-substrate capacitance, not the associated drain resistance, will affect the input circuit speed.

For a MOS transistor in an input circuit, both the drain capacitance and resistance affect the output circuit speed.

For a MOS transistor coupled between power buses, neither the drain capacitance nor the drain resistance needs to be concerned during IC speed/timing simulation. This is because the power bus typically has a large (e.g., nwell-to-psubstrate) capacitance, therefore the drain capacitance of the MOS transistor coupling between power buses is negligible. In other words, island structure implemented in a power bus ESD-protecting MOS transistor structure does not add to the complexity of simulation and modeling, since neither its associated resistance and capacitance affect timing and speed performance.

The ESD protection devices disclosed herein can be fabricated by either a silicide, salicide, or non-silicide based fabrication procedure, and are compatible with industry IC processing technology. It is known that a salicide (self-aligned silicidation) process generally means that both the diffusion and the polysilicon have silicided surfaces.

1. Definition of Island

At this point, the term "island" will be defined. Before defining the term, it is noted that an island generally performs the function of directing or diverting a portion of electrical current from a contact to near a channel.

An island can be considered as a structure or arrangement that divides or diverts electrical current. An island can be a physical structure that overlaps (either partially or completely) with an active source/drain (S/D) region. Here, an active S/D region can be defined as a region enclosed by surrounding isolation and a channel region. An island can also be a current-routing structure that does not have a clear physical structure, such as poly or field-oxide islands.

An island can also be a region that is fully or partially enclosed by a heavily doped region within an active region. Here, an active region is an active device region that is surrounded by an isolation region. For example, the source, drain and gate of a MOSFET transistor forming an active region is surrounded by an isolation (field-oxide) region. A heavily doped region can be a diffusion region (as all doped ions tend to diffuse under high temperature processing steps), which can be formed by ion implantation followed by thermal diffusion. Here, examples of an isolation region include LOCOS isolation and trench isolation.

An island may have a physical structure. Non-limiting examples include a dielectric layer over bulk (bulk can be a substrate or a well), or a floating conductive layer over a dielectric layer, or a non-floating conductive layer over a dielectric layer. Another non-limiting example of a physical island is one that at least partially overlaps with an active S/D region (e.g., of a MOSFET device) or an active emitter/collector region (e.g., of a field or bipolar device). Yet another non-limiting example of a physical island is a peninsula-like extension of the surrounding isolation region into a heavily doped region surrounded by the isolation region (i.e., an island extended from the surrounding isolation into an S/D or emitter/collector region).

A non-limiting example of a physical island with a floating conductive element feature has a floating conductor element on a dielectric element, with the floating conductor element at least partially, or fully, overlapping an S/D (or emitter/collector) region. This floating conductor element may also overlap both with an S/D (or emitter/collector) region and with an isolation region.

It is also possible for the island to not have a physical structure. As a non-limiting example, the island can be formed as an island region. A non-island region and an island region differ in that they have substantially different doping (e.g., n+ versus p doping, n+ versus n− doping, or simply being doped differently), and thus have different resistivity. As a result, such an island can have a second resistivity region located in an S/D (or emitter/collector) region having a first and different resistivity. As another non-limiting example, the non-island region and the island region may be characterized by having a silicided or non-silicided surface, regardless of whether they have the same doping or not. The resistivity of the non-island region and the island region would be different based on the silicided or non-silicided surface. Such an island can comprise a non-silicided region in a generally silicided S/D (or emitter/collector) region.

2. Embodiments with Full-Chip ESD Protection

One aspect of simplifying a full-chip ESD protection scheme is to apply the island structure only in the n+ diffusion region of the power-bus ESD protection device (e.g., NMOS or field-device transistors). A substantial portion of the ESD energy applied to an IC pin can be passed on to a power bus through forward-biasing a pull-up diode (as shown in FIG. 4), or through a parasitic p+/nwell diode of a pull-up PMOS transistor (as shown in FIG. 5). Experimental results have shown that a conventional input-pin ESD protection device (e.g., NMOS transistor) of ESD protection level of around 2.5 to 3 KV can be increased to around 4 to 5 KV when the power-bus ESD protection device has an island structure in the drain diffusion region. Therefore, the present invention seeks to selectively apply the island structure in the drain diffusion regions of ESD protection devices of an IC to achieve ESD improvement without adding unnecessary complexity to device modeling.

FIGS. 4–7 illustrate four different embodiments which illustrate different island variations for protecting the power-bus, input pins and output pins.

FIG. 4 illustrates one embodiment of the present invention, where an input-pin ESD protection NMOS transistor does not have any island structure in the drain diffusion region, while a power-bus ESD protection NMOS transistor has an island structure in the drain diffusion region. Since the input-pin ESD structure does not contain any island structure in the diffusion region, the drain capacitance, and hence the input pad capacitance, is not increased so as to simplify the modeling of the device or circuit. Referring to FIG. 4, the power-bus ESD protection device (NMOS N3) has a gate coupled to a power bus VSS through an optional resistor R3, a source coupled to the power-bus VSS, and a drain coupled to the VDD power-bus, with an island structure I1 (labeled by a cross within a circle) provided in the drain region of the power-bus ESD protection device (NMOS N3). In addition, the input-pin ESD protection device (NMOS N1) has a gate and a source, each coupled to VSS, and a drain coupled to the input pad P. The anode of a diode D1 is also coupled to the input pad P. The cathode of the diode D1 is coupled to VDD. Thus, there are no island structures in the drain region of the input-pin ESD protection device (NMOS N1). NMOS N2 and diode D2 are coupled to the power buses VSS and VDD in a similar manner as for NMOS N1 and diode D1, and function as secondary ESD protection elements. The input pad P is coupled via a resistor R1 to a first input gate X of an internal circuit.

FIG. 5 illustrates another embodiment of the present invention, where an output NMOS transistor does not have island structure in the drain diffusion region, while a power-bus ESD protection NMOS transistor has island structure in the drain diffusion region. Since the output NMOS transistor does not contain island structure in the diffusion region, the drain capacitance, and hence the associated output pin or I/O pin capacitance, is not increased so as to simplify the modeling of the device or circuit. Referring to FIG. 5, the power-bus ESD protection device (NMOS N3) has a gate and a source, each coupled to VSS, and a drain coupled to VDD, with an island structure I2 provided in the drain region of the power-bus ESD protection device (NMOS N3). The output-pin ESD protection device (N2) has a source coupled to VSS, and a drain coupled to the drain of a PMOS P2. The source of the PMOS P2 is coupled to VDD. The output pad OP is coupled to a node between the NMOS N2 and the PMOS P2. Here, NMOS N2 and PMOS P2 together form an output buffer, and there is no island structure in the drain region of the output-pin ESD protection device (N2).

FIG. 6 illustrates another embodiment of the present invention, where an input-pin ESD protection circuit uses pull-down diodes instead of pull-down NMOS transistors, while a power-bus ESD protection NMOS transistor has island structure in the drain diffusion region. Since the input-pin ESD structure does not have any NMOS transistor with island structure in the diffusion region, the input pad capacitance is not increased so as to simplify the modeling of the device or circuit. The circuit in FIG. 6 is very similar to that of the circuit in FIG. 4, except that the NMOS transistors N1 and N2 have been replaced by pull-down diodes D3 and D4, respectively. Thus, an island structure is provided in the drain region of the power-bus ESD protection device (N3), but the input pad does not have any NMOS transistor with island structure coupled to it.

It is noticed that the ESD protection of input/output (I/O) pins and output pins is typically more robust than the ESD protection of an input pin due to the fact that I/O and output pins have a large output buffer, which helps to dissipate the ESD energy. Input pins are not connected to an output buffer, and typically utilize an ESD protection circuit that is typically smaller than the ESD protection circuits for I/O pins in order to optimize the chip area. Therefore, to achieve uniform ESD protection levels between an I/O pin and an input pin, or between an output pin and an input pin, it is desirable to provide an island structure in the drain region of an input-pin associated NMOS transistor, but not in the drain region of an output transistor. As an example, for an IC, an output pin might have ESD protection level of 3.5 kV, while an input pin might have ESD protection level of 2.5 kV. If islands are provided in the drain of the input pin, both pins can reach the 3.5 kV protection level for a more uniform ESD protection.

As a result, FIG. 7 illustrates yet another embodiment of the present invention, where an output NMOS transistor (N2) does not have island structure in the drain diffusion region, while an input pin ESD protection NMOS transistor (N1) has island structure in the drain diffusion region. This arrangement allows the input pin and the output pin to achieve similar ESD protection levels. In addition, the output transistor capacitance and resistance are not increased so as to simplify the modeling of the device or circuit. Moreover, due to the improved ESD performance of NMOS N1 with the island structure, NMOS N1 can be made smaller, such that the overall input in capacitance does not increase despite the existence of the island structure in the drain region of NMOS N1. Referring to FIG. 7, the output side includes a PMOS P2, the NMOS N2 and the output pad OP in an arrangement similar to that shown in FIG. 5, with no island structure provided in the drain region of the NMOS N2. The input side includes the NMOS N1 having a gate and a source, each coupled to VSS, a drain coupled to a drain of a pull-up PMOS P1, which has a source coupled to VDD. An island structure I3 is provided in the drain region of NMOS N1. In addition, another island structure I33 is provided in the drain of the PMOS transistor P1. The input pad P is also coupled to an internal circuit X via a resistor R1 and the drain of a secondary ESD protection element NMOS N3, whose gate and source are each coupled to VSS.

3. Dual-Direction MOSFET Transistor

FIG. 8 shows an example of a multiple-supply integrated circuit that has a VDDH/VSS2 power-bus pair and a VDDL/VSS1 power-bus pair. For example, VDDH can be 3.3V, VDDL can be 2.5V, and VSS1 and VSS2 can be both at ground potential during circuit operation but not directly connected to each other for noise isolation purposes. There is a need for at least one ESD protection device between the VDDH and VDDL power buses. Therefore, two island structures I6 and I7 can be provided between the VDDH and VDDL power buses, with another two island structures I4 and I5. Island structure I4 performs the same function as island structure I2 in FIG. 5, and island structure I5 performs the same function as island structure I1 in FIG. 4.

In the circuit of FIG. 8, an input side has the NMOS N1, the NMOS N3 and the PMOS P1 coupled between VDDL and VSS1 in a manner similar to FIG. 7 above, and with the input pad P coupled to an input circuit X via a resistor R1 and the drain of a secondary ESD protection element NMOS N3, whose gate and source are each coupled to VSS1. An output side has the NMOS N2 and the PMOS P2 coupled between VDDH and VSS2, with the output pad OP coupled to a node between the NMOS N2 and the PMOS P2. The circuit in FIG. 8 also includes three additional ESD protection devices, NMOS N4, N5 and N6. One NMOS N4 has a gate coupled to VSS2 via a resistor R4, a source coupled to VSS2, and a drain coupled to VDDH power bus, with an island structure I4 (labeled by a cross within a circle) provided in the drain region of the NMOS N4. Another NMOS N6 has a gate coupled to VSS1 via a resistor R3, a source coupled to VSS1, and a drain coupled to VDDL power bus, with an island structure I5 provided in the drain region of the NMOS N6. The third NMOS N5 has a gate node that can be coupled to either VSS1, VSS2 or VDDL, with a first S/D region coupled to VDDH (e.g., 3.3V), and a second S/D region coupled to VDDL (e.g., 2.5V). An island structure I6 is provided in the first S/D region of the NMOS N5, and another island structure I7 is provided in the second S/D region of the NMOS N5. Diodes D1 and D2 are arranged between VSS1 and VSS2 to act as a buffer against noise between VSS1 and VSS2, but which passes ESD current therethrough.

FIG. 9 illustrates an example of a layout for dual-direction MOSFET with substantial island structures in both the first and second S/D regions of the NMOS N5. The MOSFET is a multi-finger gate structure with two gate fingers G1 and G2. The first S/D region (labeled S/D#1) lies between the two gate fingers G1 and G2. On the outer sides of the two gate fingers G1 and G2 is the second S/D region, which is formed by connecting sub-regions S/D#2A and S/D#2B together through metal-line connection and metal-to-diffusion contacts.

As shown in FIG. 9, the island structure includes a significant or large number of islands in both the first and second S/D regions. For example, as shown in FIG. 9, there can be the same number of islands in both the first and second S/D regions, or there can be the same number of rows of islands (e.g., two rows) in both the first and second S/D regions. Furthermore, the MOSFETs can have roughly symmetrical island structures in each of the source and drain diffusion regions. This structure is particularly useful as a dual-direction ESD protection element. For example, it can be connected between a VDDH (3.3V) power bus and a VDDL (2.5V) power bus for power-pin ESD protection of a multi-supply integrated circuit. In this case, the high ESD zapping voltage can occur in either direction of the VDDH/VDDL pair or the VDDL/VDDH pair of pin terminals.

Experimental results have showed that, although a plurality of islands in the drain region can greatly improve ESD protection level, an array of islands in the source region can somewhat degrade the degree of ESD improvement. This is because the islands in the source region increase the source-terminal resistance which raises the potential of the source diffusion region during an ESD event. It should be noted that for an NMOSFET ESD protection device to be triggered into a snap back mode for absorbing the ESD energy, the p-substrate to n+ source junction has to turn forward biased. In this regard, if the source potential is raised, then it is harder to get into the snap mode. Therefore, it is imperative that the islands in the source terminal do not substantially increase the source resistance for ESD improvement.

The layout in FIG. 9 reduces the diffusion resistance increase effect caused by the array of islands in SD#1, SD#2A and SD#2B by aligning the gaps of the islands adjacent to the gate in the source and drain diffusion regions. Note that SD#1 can be regarded as the drain region, SD#2A and SD#2B can be regarded as the source region, if VDDH is higher than VDDL. This can also mean (but it is not necessary) that the islands in the source and drain regions are also aligned. Therefore, the ESD current will flow from a gap between adjacent islands in the drain region, through the gate channel, and through another gap between adjacent island on the source region towards the contacts in the source region. As a result, the source resistance increase caused by the islands is lessened, so that the ESD performance can be improved. FIG. 10B is a cross-sectional view of the portion of the layout labeled B–B' in FIG. 9, illustrating a gap between adjacent islands in the drain and source regions. FIG. 10A is a cross-sectional view of the portion of the layout labeled A–A' in FIG. 9, illustrating the aligned islands in the drain and source regions. Since an increase in the distributed drain resistance is important for improving the ESD performance of an NMOSFET with silicided S/D diffusion regions, while an increase in the source resistance tends to lessen the degree of ESD performance improvement, the layout arrangement shown in FIG. 9 provides a structure suitable as an ESD protection device even if the drain and source terminals are:interchanged (for dual-direction ESD protection).

4. NMOSFET Transistor with Field Isolation Islands

FIG. 11A shows an alternative NMOS transistor suitable for dual-direction ESD protection. The islands in FIG. 11A are now field-isolation islands that are formed and patterned simultaneously as the isolation region around the NMOS. The layout of FIG. 11A has a gap-aligned feature and advantages that are similar to that disclosed in FIG. 9 for the two rows of islands on the two sides of a gate channel. FIG. 11B shows another example of a layout for dual-direction ESD protection, having essentially a similar layout as for FIG. 11A, except without the gap-aligned feature and advantages. In FIG. 11B, the islands on one side of a gate channel are aligned with gaps between adjacent islands on the other side of the gate channel. The layout in FIG. 11A provides islands that are symmetrical relative to the poly gate on either side of the poly gate, while the layout in FIG. 11B provides islands that are not symmetrical relative to the poly gate on either side of the poly gate. FIGS. 12A and 12B illustrate the cross-sectional views of the layout of FIG. 11A along the C–C' and D–D' lines, respectively. Examples of the isolation region can be formed by LOCOS or trench isolation.

5. Field Device with Islands for Dual-Direction ESD Protection

FIG. 13 illustrates a field device for use as an ESD protection element, that is constructed with a strip or channel of field oxide (or, equivalently, trench isolation) between two adjacent n+ diffusion regions, and having substantial islands provided in both the first and second diffusion regions. FIGS. 14A and 14B illustrate the cross-sectional views of the layout of FIG. 13 along the E–E' and F–F' lines, respectively. A field device can function as an ESD protection device with the collector/channel(base)/emitter equivalent to the drain/channel(gate)/source of a MOSFET ESD protection device. The structure disclosed in FIGS. 13, 14A and 14B can work as a dual direction ESD protection device between power buses, in a similar way as the structures disclosed in FIGS. 9 through 12B.

6. Input/Output (I/O) Pad

FIG. 15 illustrates another embodiment of the present invention which is similar to the embodiment of FIG. 7, except that the input pad P and output pad OP have been replaced by an I/O pad. As with FIG. 7, an output NMOS transistor (N2) does not have island structure in the drain diffusion region, while an input protection NMOS transistor (N1) has island structure in the drain diffusion region. Similarly, an output PMOS transistor (P2) does not have island structure in the drain diffusion region, while an input protection PMOS transistor (N2) has island structure in the drain diffusion region. As described above, this arrangement of islands in the drains of selected transistors simplifies the modeling work and maximizes the output transistor driving strength while having improved ESD performance. Referring to FIG. 15, the output side includes a PMOS P2 and the NMOS N2, with no island structure provided in the drain region of the NMOS N2 or PMOS P2. The input side includes the NMOS N1 having a gate and a source, each coupled to VSS. The NMOS N1 also has a drain coupled to a drain of a pull-up PMOS P1, which has a source coupled to VDD. An island structure I34 is provided in the drain region of NMOS N1. In addition, another island structure I35 can be optionally provided in the drain of the PMOS transistor P1. The I/O pad IO is also coupled to a node between the PMOS P2 and NMOS N2, and to an internal circuit X1 via a resistor R1 and the drain of a secondary ESD protection element NMOS N3, whose gate and source are each coupled to VSS. The I/O pad IO is also coupled to the drain of the PMOS P1 and the NMOS N1.

When the signal at node K1 (coupled to PMOS P2) is at a high level, and the signal at node K2 (coupled to NMOS N2) is at a low level, both the NMOS N2 and the PMOS P2 are turned off. In this state, the output buffer (N2/P2) is in a'so-called "tri-state" and the I/O pad IO works as an input pad, and the NMOS transistor N1 and the PMOS transistor P1 are the input transistor ESD protection devices.

FIG. 16 illustrates the parallel connection of the MOS transistors N1, N2 or lateral bipolar devices depending on whether the gates G1–G8 are polysilicon gates or isolation strips. If gates G1–G8 are isolation strips, they can take the form of those illustrated in FIG. 13 and can be formed of the same construction as the surrounding isolation region (formed of field oxide or trench isolation), with S1–S5 the emitter regions and D1–D4 the collector regions for the lateral bipolar devices. If gates G1–G8 are polysilicon gates, S1–S5 are the source regions and D1–D4 are the drain regions for the MOS transistors. As shown in FIG. 16, within the same active region, the island structures can be selectively positioned in some drain or collector regions, but not in other drain or collector regions. For example, island structure I34 is provided in the drain or collector regions D1 and D4 adjacent the ends of the active region, but not in the drain or collector regions D2 and D3 adjacent the enter of the active region. Since island structures tend to increase the capacitance or resistance of the drain/collector region, the selective positioning of island structures in selected drain or collector regions will allow capacitance to be minimized while maximizing ESD protection.

If G1–G8 are polysilicon gates, and when gates G3–G6 are coupled to signal node K2 and gates G1, G2, G7 and G8 are coupled to a VSS power bus, the structure in FIG. 16 forms the transistors N1 and N2 of the ESD protection circuit shown in FIG. 15. In other words, the input protection transistor N1 of FIG. 15 is formed by the MOS transistors with gates G1, G2, G7 and G8, source regions S1, S2, S4, S5, and drain regions D1–D4. Also, the output transistor N2 of FIG. 15 is formed by the MOS transistors with gates G3–G6, source regions S2–S4, and drain regions D2–D3. In this case, the drain nodes are coupled to the I/O pad and the source nodes are coupled are coupled to the VSS bus.

The transistors P1 and P2 of FIG. 15 can also be implemented in the same way as shown in FIG. 16 except that gates G1, G2, G7, G8 are connected to VDD, and gates G3–G6 are connected to the node K1.

FIG. 17 shows an ESD protection structure that is similar to that of FIG. 16, except that a guard ring GR is provided around the active region, and the island structure is positioned in a drain region (e.g., D2) that is at about the center of the active region. The guard ring GR can be made of a strip of ring of p+ diffusion region in a p-well or p-substrate. The structure in FIG. 17 forms the ESD protection circuit of FIG. 15 when G1–G6 are polysilicon gates, G3–G4 is coupled to a VSS power bus, G1, G2, G5, G6 are coupled to signal node K2, all drain nodes are coupled to the I/O pad, and all source nodes are coupled to a VSS power bus. In addition, the transistor N1 can be smaller than the transistor N2 in terms of total channel width. The guard ring GR can also be provided around the active region in FIG. 16.

FIG. 18 shows an ESD protection structure that is similar to that of FIG. 17, except that the transistors with gates G3, G4 and associated drains/sources (collectors/emitters) are provided in a first active region A1, and the transistors with gates G1, G2, G5, G6 and associated drains/sources (collectors/emitters) are provided in a second active region A2 that is different and separate from the first active region A1. As with the above illustrations in FIGS. 16 and 17, the transistors with gates G3 and G4 can form the transistor N1 of FIGS. 15, 19 ans 20 below, and the transistors with gates G1, G2, G5 and G6 can form the transistor N2 of FIGS. 15, 19 or 20 below.

FIG. 19 illustrates a possible modification to the circuit of FIG. 15. In FIG. 19, the PMOS transistor P1, resistor R1, NMOS N3 and internal circuit X1 have been omitted, and the NMOS transistor N1 still has a drain coupled to the I/O pad (which can also be an output pad). Island structure I34 is also provided in the drain region of the NMOS N1, with no island structure provided in the drain regions of the NMOS N2 and PMOS P2. As configured in FIG. 19, NMOS N1 is now a trigger device for the output transistor N2. The island structure I34 in the drain of transistor N1 can have lower ESD trigger voltage than the transistor N2 (which has no island structure) when the island structure I34 is formed of polysilicon or isolation and due to the diffusion-junction field-crowding effect at the corner of the islands. Thus, during an ESD event, the transistor N1 is triggered first, and once transistor N1 is triggered, the excess carrier flowing in the substrate helps to trigger transistor N2. In FIG. 19, the transistor N2 is the ESD (self) protection device and transistor N1 is the trigger device. Typically, the ESD trigger device (here, transistor N1) is smaller than the ESD protection device (here, transistor N2).

The circuit in FIG. 20 is similar to that of FIGS. 15 and 19, except that the transistor N2 is an input protection transistor. In particular, an input pad is now coupled to the drain of the transistor N2. Again, island structure I34 can be provided in the drain (or collector) of transistor N1, but not in the drain of transistor N2, such that transistor N1 can serve as a trigger device for transistor N2. The arrangement shown in FIG. 20 improves the effectiveness of transistor N2 as an ESD protection device for the input pad without adding complexity to the modeling of the input circuit. This is because, as transistor N1 is triggered and a lot of carriers are injected into the substrate, transistor N2 will also be triggered. Therefore, transistor N2 can be triggered more easily (or earlier) with transistor N1 than without transistor N1.

To further illustrate the flexibility that the present invention provides, the layout principles illustrated in FIGS. 16–18 can also be applied to the transistors N1 and N2 in FIGS. 19 and 20.

In addition, the transistors N1 and N2 in FIGS. 15, 19 and 20 are preferably arranged adjacent to each other, so that the transistor N1 (that has island structure in its drain) can be an effective trigger device for transistor N2 for improving overall ESD performance. In other words, if the transistor N1 in FIG. 15 is positioned adjacent to the transistor N2 and enclosed by a guard ring, then transistor N1 in FIG. 15 also acts as a trigger. Further, the transistors N1 and N2 in FIGS. 19 and 20 can also be surrounded by one guard ring that can be similar to the guard ring GR illustrated in FIGS. 17 and 18 above. With this arrangement, the minority carriers generated by the transistor N1 (after transistor N1 has been triggered by an ESD pulse) can more effectively trigger the other transistor N2 to improve the overall ESD performance. In this regard, a p+ guard ring GR generally helps to collect minority carriers flowing in a substrate to avoid possible latch up during device operation.

It will be recognized that the above described invention may be embodied in other specific forms without departing from the spirit or essential characteristics of the disclosure. For example, field-oxide isolation can be replaced by trench isolation. Thus, it is understood that the invention is not to be limited by the foregoing illustrative details, but rather is to be defined by the appended claims.

What is claimed is:

1. An integrated circuit device comprising:
   a substrate;
   a first node coupled to a first IC pin;
   a second node coupled to a second IC pin;
   a first electro-static discharge (ESD) protection device coupled to the first node;
   a second ESD protection device coupled to the second node;
   wherein each ESD protection device includes a semiconductor transistor structure that has a drain region, a source region, and a channel formed between the drain and source regions; and
   at least one island overlapping at least a portion of the drain region of the first ESD protection device, with the drain region of the second ESD protection device devoid of any islands.

2. The device of claim 1, wherein the at least one island is formed of an isolation layer.

3. The device of claim 1, wherein the at least one island has a structure that at least partially overlaps with an active source/drain region.

4. The device of claim 1, wherein the at least one island has a structure that is at least partially enclosed by a heavily doped region within an active region.

5. The device of claim 1, wherein the at least one island comprises a doped region having a doping profile that is different from an adjacent non-island region.

6. The device of claim 1, wherein the at least one island comprises a conductive region having a resistivity that is different from an adjacent non-island region.

7. The device of claim 1, wherein a dielectric element is formed over the channel.

8. The device of claim 7, wherein a poly gate is formed over the dielectric element.

9. The device of claim 1, wherein the first IC pin is coupled to a power bus and the second IC pin is an input pin.

10. The device of claim 1, wherein the first IC pin is coupled to a power bus and the second IC pin is an output pin.

11. The device of claim 1, wherein the first IC pin is coupled to a power bus and the second IC pin is a non-power bus pin.

12. The device of claim 1, wherein the first IC pin is an input pin and the second IC pin is an output pin.

13. The device of claim 1, wherein the first IC pin and the second IC pin are the same pin, with the first node coupled to an internal circuit through a resistor and the second node coupled to a first ESD protection device which is an output transistor.

14. The device of claim 13, further including a second ESD protection device which is adjacent to the first ESD protection device.

15. The device of claim 1, wherein the device includes an active region, and the first and second ESD protection devices are both positioned in the same active region.

16. An integrated circuit device having a substrate and an electrostatic discharge (ESD) protection device having a composite transistor that comprises:

a plurality of drain regions formed in the substrate, the plurality of drain regions including a first set of drain regions and a second set of drain regions;

at least one island overlapping at least a portion of each of the first set of drain regions, and wherein each of the second set of drain regions is devoid of any islands; and wherein said composite transistor is coupled between a first node and a second node, with the first and second sets of drain regions coupled to the first node.

17. The device of claim 16, wherein the transistor includes an active region that has a first end and a second end, wherein the first set of drain regions are positioned adjacent the first and second ends of the active region.

18. The device of claim 16, wherein the transistor includes an active region that has a central portion, wherein the first set of drain regions are positioned in the central portion.

19. The device of claim 16, further including a guard ring in the substrate that encloses the first and second sets of drain regions.

20. The device of claim 16, further including a first active region and a second active region, with the first set of drain regions positioned in the first active region, and the second set of drain regions positioned in the second active region.

21. An integrated circuit device having a composite bipolar device that comprises:

a plurality of emitter regions that includes a first set of emitter regions and a second set of emitter regions; and at least one island overlapping at least a portion of each of the first set of emitter regions, and wherein each of the second set of emitter regions is devoid of any islands; and wherein said composite bipolar device is coupled between a first node and a second node, with the first and second sets of emitter regions coupled to the first node.

* * * * *